United States Patent [19]

Kelley et al.

[11] 4,355,285
[45] Oct. 19, 1982

[54] AUTO-ZEROING OPERATIONAL AMPLIFIER CIRCUIT

[75] Inventors: Stephen H. Kelley; Richard W. Ulmer; Roger A. Whatley, all of Austin, Tex.

[73] Assignee: Motorola, Inc., Schaumburg, Ill.

[21] Appl. No.: 231,079

[22] Filed: Feb. 3, 1981

[51] Int. Cl.³ .............................................. H03F 1/02
[52] U.S. Cl. ....................................................... 330/9
[58] Field of Search ..................... 330/9; 328/127, 162

[56] References Cited

U.S. PATENT DOCUMENTS 4,297,642 10/1981 Baldwin et al. ......................... 330/9

FOREIGN PATENT DOCUMENTS 1567309 5/1980 United Kingdom .................... 330/9

Primary Examiner—James B. Mullins
Attorney, Agent, or Firm—Anthony J. Sarli, Jr.; Jeffrey Van Myers; Robert L. King

[57] ABSTRACT

A temperature stable bandgap voltage reference source utilizing bipolar transistors biased at different emitter current densities is provided. Switched capacitors are used to input the $V_{be}$ and the $\Delta V_{be}$ of the transistors (PTC and NTC voltages, respectively,) into an operational amplifier to provide a reference voltage proportional to the sum of the PTC and NTC voltages. Proper selection of the ratio of the switched capacitors renders the reference voltage substantially independent of temperature. In a modified form of the reference, the reference amplifier is implemented by an auto-zeroed operational amplifier which uses switched capacitor techniques and an integrated capacitor to achieve the auto-zeroing function.

5 Claims, 4 Drawing Figures

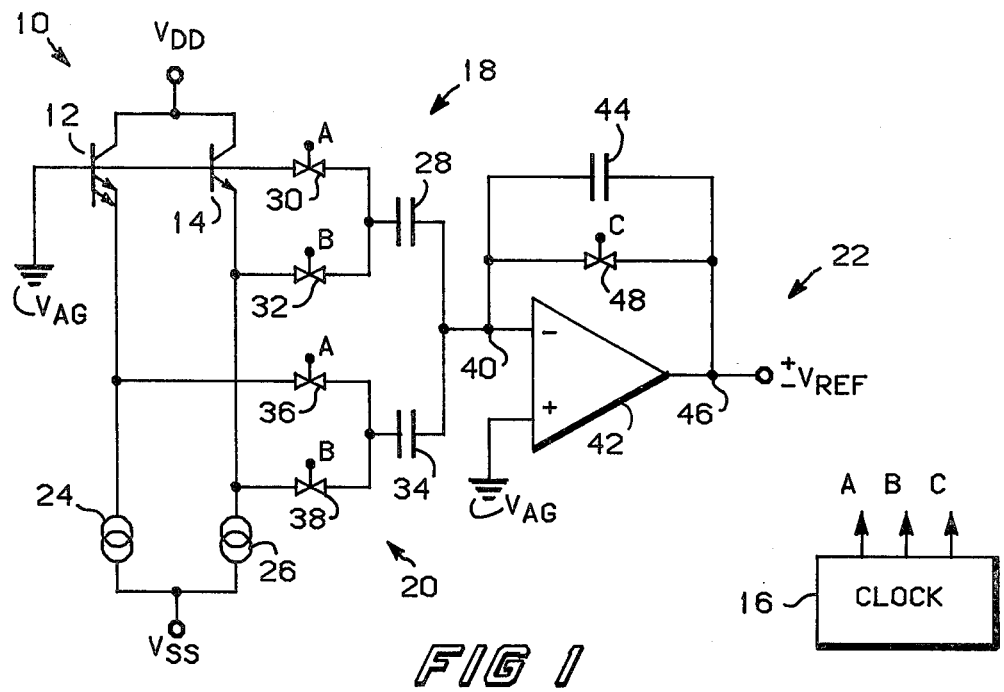
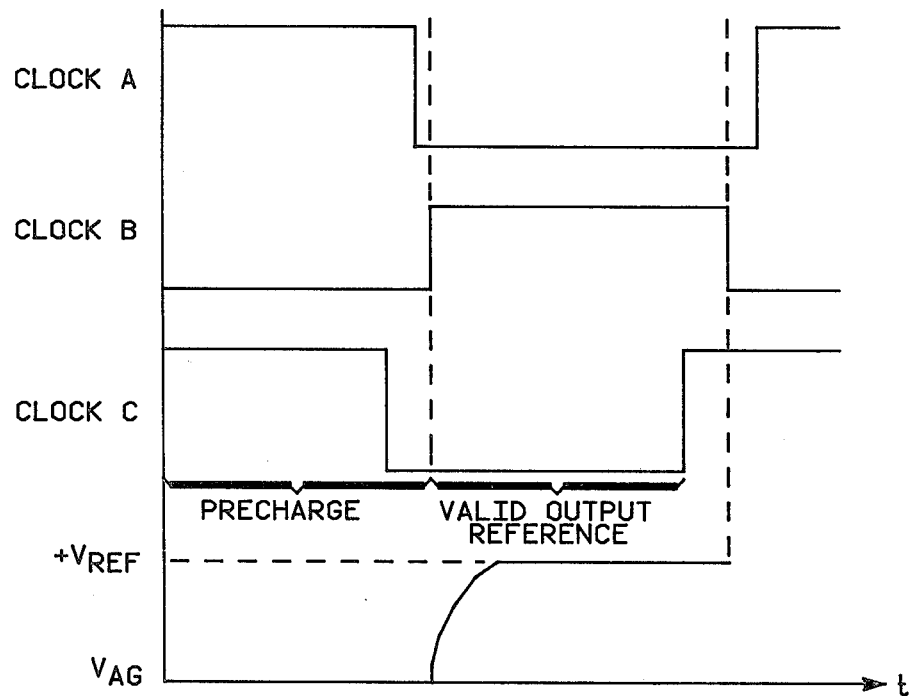
FIG 1
FIG 2

AUTO-ZEROING OPERATIONAL AMPLIFIER CIRCUIT

CROSS REFERENCE TO RELATED APPLICATIONS

Related subject matter can be found in the following copending application, which is assigned to the assignee, hereof:

Application Ser. No. 231,073, entitled "SWITCHED CAPACITOR BANDGAP REFERENCE" filed simultaneously herewith by Richard W. Ulmer and Roger A. Whatley.

BACKGROUND OF THE INVENTION

1. Field of the Invention

This invention relates generally to operational amplifier circuits, and more particularly, to an auto-zeroing operational amplifier circuit.

2. Description of the Prior Art

In general, operational amplifier offset voltage compensation circuits have reduced offset voltage error by applying a cancelling voltage at the input of the operational amplifier in one of two ways. One way is to utilize the power supply to generate a cancelling voltage of opposite polarity to the offset voltage across a resistor divider network. In general, such circuits required at least one variable resistor to facilitate compensation for the numerous variable circuit parameters which affect the value of the offset voltage. Such circuits have been found to be unsatisfactory in some situations since they require constant adjustment of the variable resistance and tend to introduce noise from the power supply.

A second way to reduce offset voltage error with a cancelling voltage at the operational amplifier's input is to utilize switched capacitor techniques to periodically charge a capacitor, external to the integrated circuit containing the operational amplifier, to a voltage approximately equal but of opposite polarity from the offset voltage. Such switched capacitor circuits are susceptible to external noise due to the high impedance of the external circuit node connection, and the external capacitor also increases the pin count of the integrated circuit.

SUMMARY OF THE INVENTION

It is an object of the present invention to provide a circuit for automatically zeroing the offset voltage of an operational amplifier using a switched capacitance technique requiring no external capacitors.

Another object of the present invention is to provide an auto-zeroing circuit that is precise for both AC and DC parameters.

These and other objects of the invention are achieved in accordance with a preferred embodiment of the invention by providing an operational amplifier having a positive input coupled to a reference voltage, a negative input, and an output. An input voltage developed on an input node is coupled to the negative input of the operational amplifier via an offset storage capacitor. During an offset compensation period, a pair of switches are closed to couple the input node to the reference voltage and the negative input of the operational amplifier to the output thereof, charging the offset storage capacitor to the offset voltage of the operational amplifier. During a subsequent period, the switches are opened to trap the charge on the capacitor, thus developing a voltage of equal magnitude but opposite polarity to the offset voltage, across the operational amplifier's input terminals. In a preferred form, means are provided to discharge the feedback capacitor normally connected between the output of the operational amplifier and the input node when the circuit is operating in the offset compensation period.

BRIEF DESCRIPTION OF THE DRAWINGS

FIG. 1 is a schematic diagram illustrating a switched capacitor bandgap reference circuit coupled to an operational amplifier circuit.

FIG. 2 is a graphic timing diagram for the schematic diagram shown in FIG. 1.

DESCRIPTION OF THE PREFERRED EMBODIMENT

Figure 3:
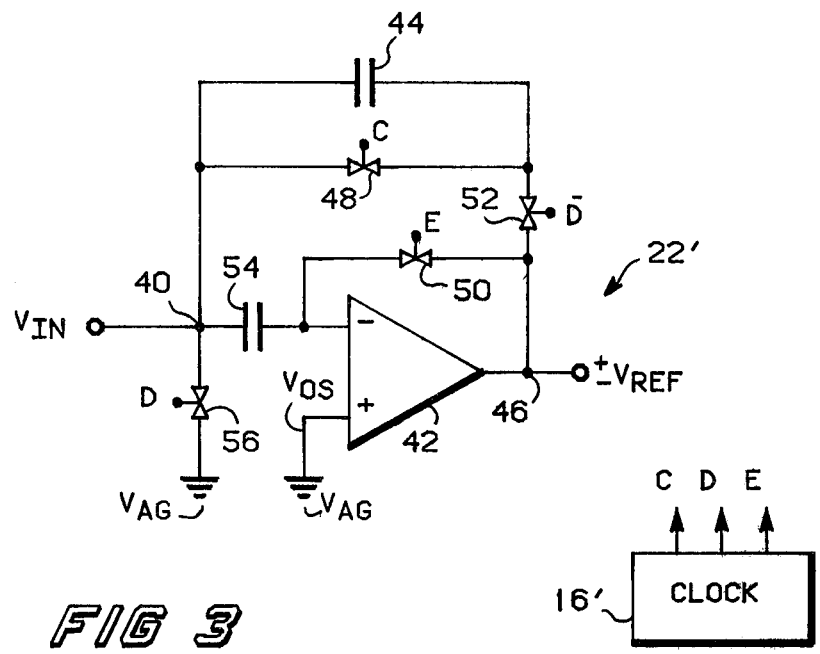
FIG. 3 is a schematic diagram illustrating a preferred embodiment of the amplifier used in the present invention.

Shown in FIG. 1, is a switched capacitor bandgap reference circuit 10 constructed in accordance with the preferred embodiment of this invention. The bandgap reference circuit 10 is comprised generally of first and second bipolar transistors 12 and 14, respectively, a clock circuit 16, a first switched capacitance circuit 18, a second switched capacitance circuit 20, and an amplifier circuit 22.

Each of the first and second bipolar transistors 12 and 14 has the collector thereof connected to a positive supply $V_{dd}$, the base thereof connected to a common reference voltage, say analog ground $V_{ag}$, and the emitter thereof connected to a negative supply $V_{ss}$ via respective current sources 24 and 26. In the preferred form, the current sources 24 and 26 are constructed to sink a predetermined ratio of currents, and transistor 12 is fabricated with a larger emitter area than the transistor 14. Since the transistors 12 and 14 are biased at different current densities they will thus develop different base-to-emitter voltages, $V_{be}$. Because the transistors 12 and 14 are connected as emitter followers, the preferred embodiment may be fabricated using the substrate NPN in a standard CMOS process.

In the first switched capacitance circuit 18, a capacitor 28 has an input connected via switches 30 and 32 to the common reference voltage $V_{ag}$ and the emitter of transistor 14, respectively. In the second switched capacitance circuit 20, a capacitor 34 has an input connected via switches 36 and 38 to the emitter of transistors 12 and 14, respectively. Capacitors 28 and 34 have the outputs thereof connected to a node 40. In the preferred embodiment, switches 30, 32, 36, and 38 are CMOS transmission gates which are clocked in a conventional manner by the clock circuit 16. Switches 30 and 36 are constructed to be conductive when a clock signal A applied to the control inputs thereof is at a high state, and non-conductive when the clock signal A is at a low state. In contrast, switches 32 and 38 are preferably constructed to be conductive when a clock signal B applied to the control inputs thereof is at a high state and non-conductive when the clock signal B is at a low state.

In this configuration, switches 30 and 32 will cooperate to charge capacitor 28 alternately to the base voltage of transistor 14 and the emitter voltage of transistor 14, thus providing a charge related to $V_{be}$ of transistor 14. Simultaneously, switches 36 and 38 cooperate to charge capacitor 34 alternately to the emitter voltage of transistor 12 and the emitter voltage of transistor 14, thus providing a charge related to the difference between the base to emitter voltages, i.e., the $\Delta V_{be}$, of the transistors 12 and 14. As will be clear to those skilled in the art, the voltage, $V_{be}$, will exhibit a negative temperature coefficient (NTC). On the other hand, it is well known that the voltage $\Delta V_{be}$ exhibits a positive temperature coefficient (PTC). Thus, it will be clear that the weighted sum of these voltages, $V_{be} + K\Delta V_{be}$, where $K = C_{34}/C_{28}$ may be made substantially temperature independent by appropriate selection of the ratio of capacitors 28 and 34.

In the amplifier circuit 22, an operational amplifier 42 has its negative input coupled to node 40 and its positive input coupled to the reference voltage $V_{ag}$. A feedback capacitor 44 is coupled between the output of operational amplifier 42 at node 46 and the negative input of the operational amplifier at node 40. In the preferred form, a switch 48 is coupled across feedback capacitor 44 with the control input thereof coupled to clock signal C provided by clock circuit 16. By periodically closing switch 48, the operational amplifier 42 is placed in unity gain, and any charge on capacitor 44 is removed.

As shown in FIG. 2, the clock circuit 16 initially provides the clock signal A in a high state to close switches 30 and 36, and clock signal B in a low state to open switches 32 and 38. Simultaneously, the clock circuit circuit 16 provides the clock signal C in a high state to close the switch 48. During this precharge period, feedback capacitor 44 is discharged, and, ignoring any amplifier offset, capacitors 28 and 34 are charged to the reference voltage, $V_{ag}$, and the $V_{be}$ of the transistor 12, respectively. A short time before the end of the precharge period, the clock circuit 16 opens switch 48 by providing the clock signal C in a low state. Shortly thereafter, but still before the end of the precharge period, the clock 16 opens switches 30 and 36 by providing the clock signal A in the low state. At the end of the precharge period and the start of a valid output reference period, the clock circuit 16 closes switches 32 and 38 by providing the clock signal B in the high state. At this time, the voltage on the terminals of capacitor 28 changes by $-B_{be}$ of transistor 14 and the voltage on the terminals of capacitor 34 changes by the difference between the base to emitter voltages of the transistors 12 and 14 ($V_{be12} - V_{be14}$). This switching event causes an amount of charge $Q = -V_{be14}C_{28} + (V_{be12} - V_{be14}) C_{34}$ to be transferred to capacitor 44 resulting in an output voltage of $V_{ref} = -1/C_{44}[-V_{be14}C_{28} + (V_{be12} - V_{be14}) C_{34}]$ on node 46. In the preferred form, this positive bandgap reference voltage, $+V_{ref}$, is made substantially temperature independent by making the ratio of capacitors 28 and 34 equal to the ratio of the temperature coefficients of $\Delta V_{be}$ and $V_{be}$. If desired, a negative bandgap reference voltage, $-V_{ref}$, may be obtained by inverting clock signal C.

Figure 4:
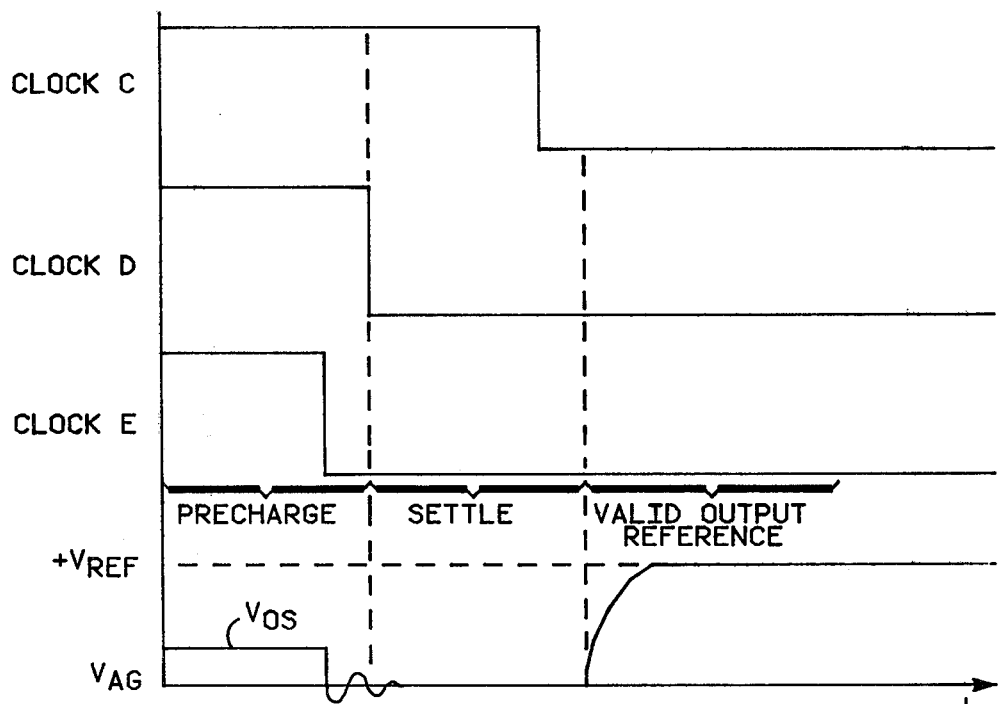
FIG. 4 is a graphic timing diagram for the schematic embodiment shown in FIG. 3.

In general, the accuracy of the bandgap circuit 10 will be adversely affected by the offset voltage of the operational amplifier. FIG. 3 illustrates in schematic form, a modified form of amplifier circuit 22' which can be substituted for the amplifier circuit 22 of FIG. 1 to substantially eliminate the offset voltage error. Amplifier circuit 22' is comprised of the operational amplifier 42 which has its positive input coupled to the reference voltage $V_{ag}$. A switch 50 couples the negative input of the operational amplifier 42 to the output terminal at node 46. Switch 48 is coupled in parallel to feedback capacitor 44 and periodically discharges the feedback capacitor. However, one terminal of the feedback capacitor 44 is now connected via a switch 52 to the output of the operational amplifier 42 at node 46. Capacitor 44 is also coupled to an input signal, $V_{IN}$, at node 40. In addition, an offset storage capacitor 54 is coupled between node 40 and the negative input terminal of operational amplifier 42, and a switch 56 is connected between node 40 and the reference voltage $V_{ag}$. In this embodiment, the clock circuit 16' generates the additional clock signals D and E, as shown in FIG. 4 for controlling the switches 56 and 50, respectively, with the inverse of clock signal D controlling switch 52. In this configuration, the bandgap reference circuit 10 has three distinct periods of operation. During the precharge period, the clock circuit 16' provides clock signals C, D, and E in the high state to close switches 48, 56 and 50 and open switch 52. During this period, capacitor 44 is discharged by switch 48. The operational amplifier 42 is placed in unity gain by switch 50, and the offset storage capacitor 54 is charged to the offset voltage, $V_{os}$, of the operational amplifier 42. Near the end of the precharge period, the clock circuit 16' provides clock signal E in the low state to open switch 50, leaving capacitor 54 charged to the offset voltage of the operational amplifier 42. A short time thereafter, the clock circuit 16' provides clock signal D in the low state to open switch 56 and close switch 52. Since this switching event tends to disturb the input node 40, a short settling time is preferably provided before clock circuit 16' provides clock signal C in the low state to open switch 48. Thereafter, the charge stored on feedback capacitor 44 will be changed only by a quantity of charge coupled from the switched capacitor sections 18 and 20. During this third period of circuit operation, labeled the valid output reference period, the reference voltage developed on the node 46 will be substantially free of any offset voltage error. If the offset capacitor 54 is periodically charged to the offset voltage, $V_{os}$, the operational amplifier 42 is effectively auto-zeroed, with node 40 being the zero-offset input node.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. In combination with an operational amplifier having a positive input terminal coupled to a reference voltage, a negative input terminal, and an output terminal, a circuit for compensating for the offset voltage of the operational amplifier, the circuit comprising:

offset capacitance means having first and second terminals, the first terminal being coupled to the negative input of the operational amplifier;

offset switching means for coupling the first terminal of the offset capacitance means to the output terminal of the operational amplifier, and coupling the second terminal of the offset capacitance means to the reference voltage during an offset compensation period; and feedback capacitance means having first and second terminals, the first terminal being coupled to the second terminal of the offset capacitance means and, the second terminal being coupled to the output terminal of said operational amplifier.

2. In combination with an operational amplifier having a positive input terminal coupled to a reference voltage, a negative input terminal, and an output terminal, a circuit for compensating for the offset voltage of the operational amplifier, the circuit comprising:

offset capacitance means having first and second terminals, the first terminal being coupled to the negative input of the operational amplifier;

offset switching means for coupling the first terminal of the offset capacitance means to the output terminal of the operational amplifier, and coupling the second terminal of the offset capacitance means to the reference voltage during an offset compensation period;

feedback capacitance means having first and second terminals, the first terminal being coupled to the second terminal of the offset capacitance means and the second terminal being coupled to the output terminal of the operational amplifier; and, feedback switching means for coupling the output terminal of the operational amplifier to the second terminal of the feedback capacitance means except during the offset compensation period.

3. The circuit of claim 2 further comprising:

feedback capacitance switching means for coupling the first and second terminals of the feedback capacitance means except during the valid reference output period.

4. The circuit of claim 3 further comprising:

clock means for providing non-overlapping clock signals which control all switching means.

5. The circuit of claims 1 or 2 further comprising:

means for coupling the second terminal of the offset capacitance means to an input voltage during a valid reference output period which is different from the offset compensation period.

* * * * *